US012771331B2

(12) United States Patent
Kalyanam et al.

(10) Patent No.: US 12,771,331 B2
(45) Date of Patent: Oct. 20, 2026

(54) VOLTAGE REGULATOR NOISE MITIGATION WITH PROCESSOR CONTROL

(71) Applicant: QUALCOMM Incorporated, San Diego, CA (US)

(72) Inventors: Vijay Kiran Kalyanam, Austin, TX (US); Todd Robert Sutton, Del Mar, CA (US); Suresh Kumar Venkumahanti, Austin, TX (US); Chi-Jui Chung, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 147 days.

(21) Appl. No.: 18/789,502

(22) Filed: Jul. 30, 2024

(65) Prior Publication Data

US 2026/0039281 A1 Feb. 5, 2026

(51) Int. Cl.

| | |
|---|---|
| ***G06F 1/00*** | (2006.01) |
| ***G05F 1/56*** | (2006.01) |
| ***G06F 11/30*** | (2006.01) |
| ***H03K 5/1252*** | (2006.01) |

(52) U.S. Cl.
CPC ............. *H03K 5/1252* (2013.01); *G05F 1/56* (2013.01)

(58) Field of Classification Search
CPC ................................ H03K 5/1252; G06F 1/56
See application file for complete search history.

(56) References Cited

U.S. PATENT DOCUMENTS

| | | | | |
|---|---|---|---|---|
| 9,942,108 | B2 * | 4/2018 | Yermakov | H04L 41/5054 |
| 11,537,853 | B1 * | 12/2022 | Afzal | G06F 5/01 |
| 2015/0378412 | A1 * | 12/2015 | Suryanarayanan | G06F 9/3836 713/340 |
| 2017/0249149 | A1 * | 8/2017 | Priyadarshi | G06F 9/30021 |
| 2018/0026640 | A1 * | 1/2018 | Shankar | H03K 19/177 326/44 |
| 2021/0049446 | A1 * | 2/2021 | Gurumurthi | G06N 3/084 |
| 2021/0089480 | A1 * | 3/2021 | Chan | G06F 9/45558 |
| 2024/0143330 | A1 | 5/2024 | Houston et al. | |
| 2025/0004516 | A1 * | 1/2025 | Popovic | G06F 1/26 |
| 2025/0202462 | A1 * | 6/2025 | Yin | G06F 1/30 |

OTHER PUBLICATIONS

International Search Report and Written Opinion PCT/US2025/033083 ISA/EPO Oct. 6, 2025.

* cited by examiner

*Primary Examiner* — Mohammed H Rehman
(74) *Attorney, Agent, or Firm* — Seyfarth Shaw LLP

(57) ABSTRACT

A method for voltage regulator noise mitigation with processor control is described. The method includes monitoring a power consumption of a sum of processor threads during thread pipeline execution. The method also includes detecting a voltage regulator noise when the power consumption exceeds a slew power threshold. The method further includes controlling slew ramp-up steps of all the processor threads according to a selected throttle control.

18 Claims, 6 Drawing Sheets

VOLTAGE REGULATOR NOISE MITIGATION WITH PROCESSOR CONTROL

BACKGROUND

Field of the Disclosure

Aspects of the present disclosure relate to voltage regulators of integrated circuits (ICs) and more specifically to voltage regulator noise mitigation with processor control.

Background

A voltage regulator produces voltages (commonly referred to as an operating voltage (VOP)) that drive various sub-systems of an integrated circuit (IC) or system-on-chip (SoC). In practice, voltage regulator specifications are violated when a load current ramp rate of a processor exceeds the load current ramp rate specified by a power management integrated circuit (PMIC) of the voltage regulator. Unfortunately, violations of the load current ramp rate set by the PMIC specification may result in large PMIC voltage noise, such as voltage droops. Voltage droops increase a minimum voltage of operation (Vmin), leading to a reliability issue for the processor. A voltage regulator noise mitigation with processor control is desired.

SUMMARY

A method for voltage regulator noise mitigation with processor control is described. The method includes monitoring a power consumption of a sum of processor threads during thread pipeline execution. The method also includes detecting a voltage regulator noise when the power consumption exceeds a slew power threshold. The method further includes controlling slew ramp-up steps of all the processor threads according to a selected throttle control.

A voltage regulator noise mitigation system is described. The voltage regulator noise mitigation system includes a voltage regulator and a power management integrated circuit (PMIC). The voltage regulator noise mitigation system also includes a multi-threaded processor. The multi-threaded processor includes a slew-ramp control circuit to control slew ramp-up steps of each processor thread according to a selected throttle control when a noise violation of the voltage regulator is detected due to power consumption of the multi-threaded processor exceeding a slew power threshold specified by the PMIC.

This has outlined, broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for conducting the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
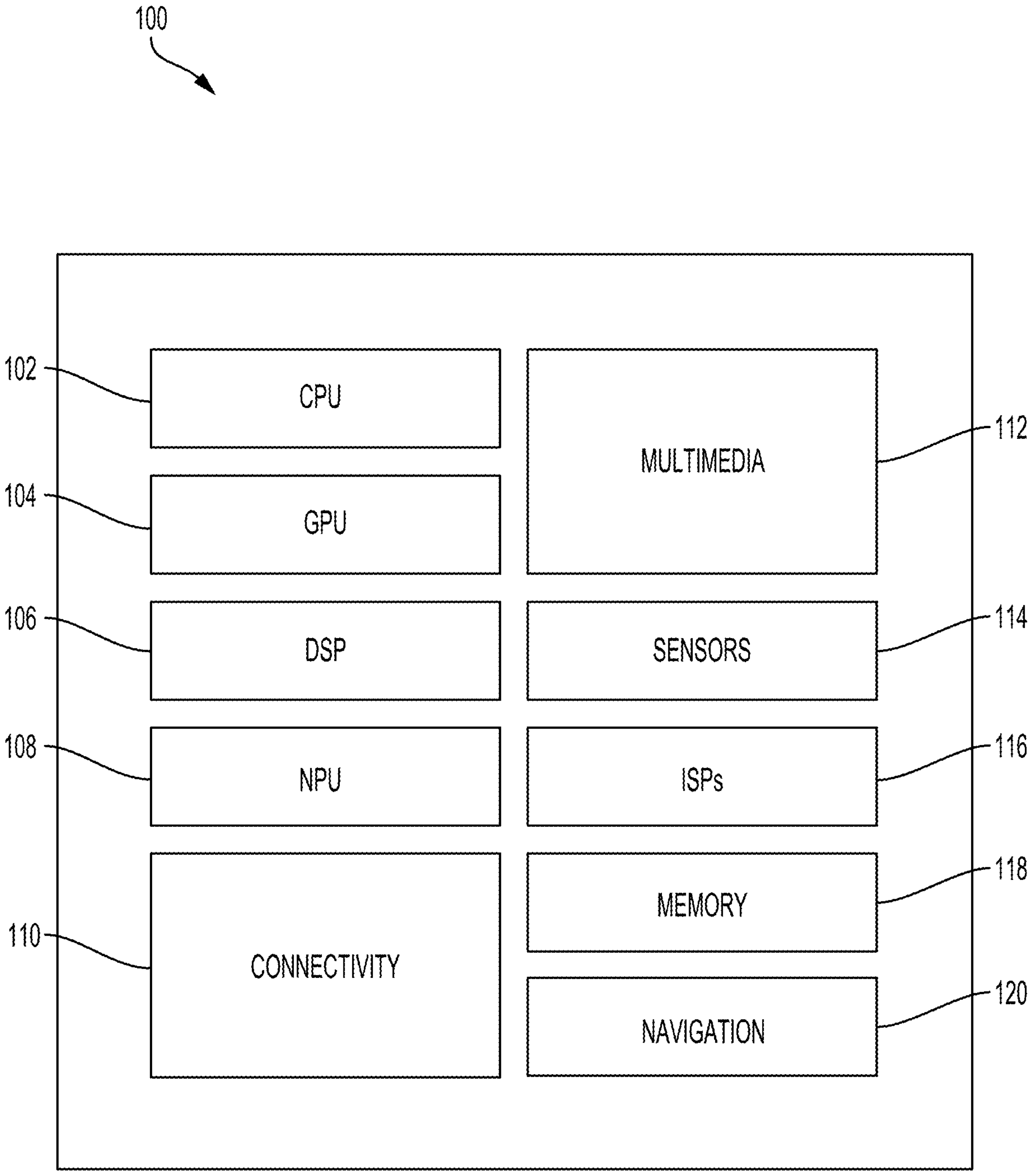
FIG. 1 illustrates an example implementation of a host system-on-chip (SoC), which is configured for voltage regulator noise mitigation with processor control, in accordance with various aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

In practice, voltage regulators are relied on for generating operating voltages (VOPs) that drive the sub-systems of a system-on-chip (SoC) used in various systems. Sub-systems (SS) of an SoC rely on an interface to dynamically adapt the VOP supplied by a voltage regulator under the control of a power management integrated circuit (PMIC). Reduced latency for managing voltage regulator outputs (e.g., VOP) as well as power optimization for battery operated designs are desired sub-system voltage management power optimizations. Additionally, reduced latency in managing the output voltage (e.g., VOP) of the voltage regulator improves thermal profile management of the SoC.

In practice, voltage regulator specifications are violated when a load current ramp rate of a processor exceeds the load current ramp rate specified by a power management integrated circuit (PMIC). During operation, a neural processor unit (NPU) exhibits a substantial load current ramp rate. For example, a dynamic load current of an NPU may ramp from approximately zero amps (~0 A) to approximately twelve amps (~12 A) over a small period (e.g., <10 nanoseconds (ns) at one gigahertz (GHz). In this example, a load current ramp rate specified by a PMIC specification (e.g., 2 A/100 ns per phase) is exceeded by the dynamic load current of the NPU. Unfortunately, violations of the load current ramp rate set by the PMIC specification result in large PMIC voltage noise. For example, voltage droops increase a minimum voltage of operation (Vmin), leading to a reliability issue for the processor. Additionally, voltage noise induced by on-die processors on voltage regulators is low-frequency.

This noted PMIC voltage noise problem is further exacerbated in new product generation. High performance machine learning/artificial intelligence accelerators, central processing units (CPUs), and graphics processor units (GPUs) consume excessive amounts of power with sudden demands for large current loads, exceeding PMIC specifications. Additionally, enhanced PMICs remain limited by PMIC/board resistor (R) inductor (L) capacitor (C) (RLC) limitations due to inefficient physical placement/electrical characteristics of PMIC/printed circuit board (PCB)/RLC boards. Third party PMICs as well as low-cost PMICs exhibit a slower dynamic response and a lower buck capacity, which further exacerbates the voltage regulator noise issue. A solution for detection and mitigation of the noted PMIC voltage noise violations is desired.

Various aspects of the present disclosure are directed to voltage regulator noise mitigation utilizing processor control. In various aspects of the present disclosure, a processor slew-ramp control mitigates volage regulator noise. In some implementations, the processor slew-ramp control circuit is configured to slowly perform slew ramp-up steps of a processor (e.g., a neural processor unit (NPU)) when coming out of idle and/or while transitioning to a higher power while executing at a lower power after violation of a slew power threshold that eventually results in a PMIC voltage noise violation. In some implementations, the processor slew-ramp control circuit is configurable to account for or not account for an inductor cool-off time of the voltage regulator.

FIG. 1 illustrates an example implementation of a system-on-chip (SoC) 100, which is configured for voltage regulator noise mitigation with processor control, in accordance with various aspects of the present disclosure. The SoC 100 includes processing blocks tailored to specific functions, such as a connectivity block 110. The connectivity block 110 may include sixth generation (6G), connectivity fifth generation (5G) new radio (NR) connectivity, fourth generation long term evolution (4G LTE) connectivity, Wi-Fi connectivity, USB connectivity, Bluetooth® connectivity, Secure Digital (SD) connectivity, and the like.

In this configuration, the SoC 100 includes various processing units that support multi-threaded operation. For the configuration shown in FIG. 1, the SoC 100 includes a multi-core central processing unit (CPU) 102, a graphics processor unit (GPU) 104, a digital signal processor (DSP) 106, and a neural processor unit (NPU) 108. The SoC 100 may also include a sensor processor 114, image signal processors (ISPs) 116, a navigation module 120, which may include a global positioning system, and a memory 118. The multi-core CPU 102, the GPU 104, the DSP 106, the NPU 108, and the multimedia engine 112 support various functions such as video, audio, graphics, gaming, artificial networks, and the like. Each processor core of the multi-core CPU 102 may be a reduced instruction set computing (RISC) machine, an advanced RISC machine (ARM), a microprocessor, or some other type of processor. The NPU 108 may be based on an ARM instruction set.

During operation, the processors of the SoC 100 may exhibit a substantial load current ramp rate. For example, a dynamic load current of the NPU 108 may ramp from approximately zero amps (~0 A) to approximately twelve amps (~12 A) over a small period (e.g., <10 nanoseconds (ns) at 1 gigahertz (GHz)). In this example, a load current ramp rate specified by a power management integrated circuit (PMIC) specification (e.g., 2 A/100 ns per phase) is exceeded by the dynamic load current of the NPU 108. Unfortunately, violations of the load current ramp rate set by the PMIC specification result in large PMIC voltage noise. For example, voltage droops due to the dynamic load current of the NPU 108 increase a minimum voltage of operation (Vmin), leading to a power reliability issue of the NPU 108.

Figure 2:
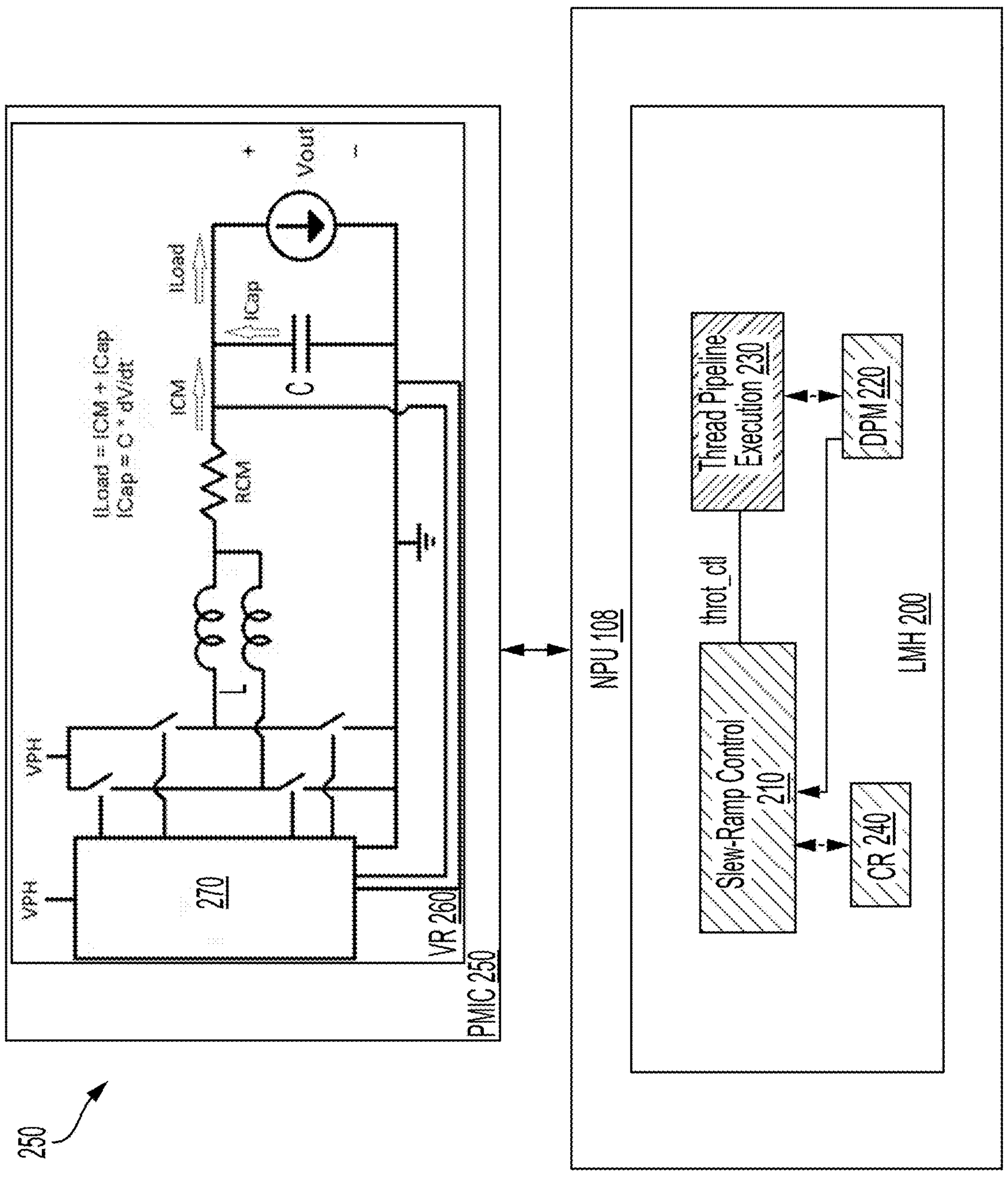
FIG. 2 is a block diagram illustrating a multi-threaded processor configured for voltage regulator noise mitigation utilizing processor control, in accordance with various aspects of the present disclosure.

FIG. 2 is a block diagram illustrating a multi-threaded processor configured for voltage regulator noise mitigation utilizing processor control, in accordance with various aspects of the present disclosure. As shown in FIG. 2, a neural signal processor (NSP) 108 includes a limits management hardware (LMH) system 200 configured to control voltage regulator noise mitigation, in accordance with various aspects of the present disclosure. Although shown as implemented in the NPU 108, the LMH system 200 configured for voltage regulator noise mitigation may be implemented in any of the processors (e.g., the multi-core CPU 102, the GPU 104, the DSP 106, and/or a neural processor unit (NPU)) (also referred to as an NPU 108) of the SoC 100.

In various aspects of the present disclosure, the NPU 108 receives an operating voltage (VOP) supplied by a voltage regulator (VR) 260 under control of a power management integrated circuit (PMIC) 250. In operation, a VR controller 270 of the VR 260 receives an output voltage (e.g., phase voltage (VPH)) from an inverter. During conventional operation, a voltage droops due to a load current as seen by the PMIC 250 (e.g., ILoad=ICM+(ICap=C*dV/dT) of the VR 260 increasing a minimum voltage of operation (Vmin), leading to a reliability issue for the NPU 108. ICM is the current through the RCM resistor, ICap is the capacitive current, C is the size of the capacitor, and dV/dT is the rate of change of voltage change over time. The VR 260 further includes inductors (L) and a resistor (RCM) coupled to the inductors L. In this example, the load current (ILoad) of the NPU 108 exceeded the load current ramp rate specified by the PMIC 250. Unfortunately, violations of the load current ramp rate set by the PMIC 250 result in large voltage noise.

According to various aspects of the present disclosure, the LMH system 200 of the NPU 108 includes a slew-ramp control 210 configured to mitigate voltage noise from the VR 260. According to various aspects of the present disclosure, the slew-ramp control 210 provides on-die violation detection of slew-rates specified by the PMIC 250. For example, the slew-ramp control 210 utilizes configuration registers (CR) 240 as well as a digital power meter (DPM) 220 to measure or estimate power consumption of a thread pipeline execution 230 (e.g., thread pipeline execution units) of the NPU 108 to provide a voltage regulator noise mitigation system.

As shown in FIG. 2, the NPU 108 is configured for multi-threaded execution of multiple processor threads. In operation, a sum of the processor threads executing in the thread pipeline execution 230 are monitored to determine whether a slew power threshold is exceeded, resulting in a voltage noise violation by the VR 260. In various aspects of the present disclosure, the slew-ramp control 210 utilizes a throttle control (throt_ctl) to slowly ramp up the NPU 108 when coming out of idle and/or while transitioning to a higher power while executing at a lower power after violation of a slew power threshold.

In operation, load currents seen by the PMIC 250 (e.g., ICM) are indirectly estimated by using the DPM 220 to provide a sum of power of the processor threads executing in the thread pipeline execution 230. In the example, the load currents seen by the PMIC 250 (e.g., ICM) are monitored to determine whether a slew power threshold is exceeded, resulting in a noise violation by the VR 260. According to various aspects of the present disclosure, the slew-ramp control 210 detects violation of slew-rates specified by the PMIC 250 by utilizing the CR 240 as well as the DPM 220 to monitor power consumption of the thread pipeline execution 230 of the NPU 108 to determine whether a slew power threshold is exceeded.

In various aspects of the present disclosure, following a detected noise violation, the slew-ramp control 210 utilizes a throttle control (throt_ctl) to slowly ramp up the NPU 108. For example, the slow ramp up of the NPU 108 is performed when coming out of idle and/or while transitioning to a higher power while executing at lower power after violation of a slew power threshold. In some implementations, the slew-ramp control 210 slowly ramps up the processor execution through control of instruction-issue, such as reducing instruction-issue (e.g., a number of instructions issued) for introducing stalls in the thread pipeline execution 230.

Figure 3:
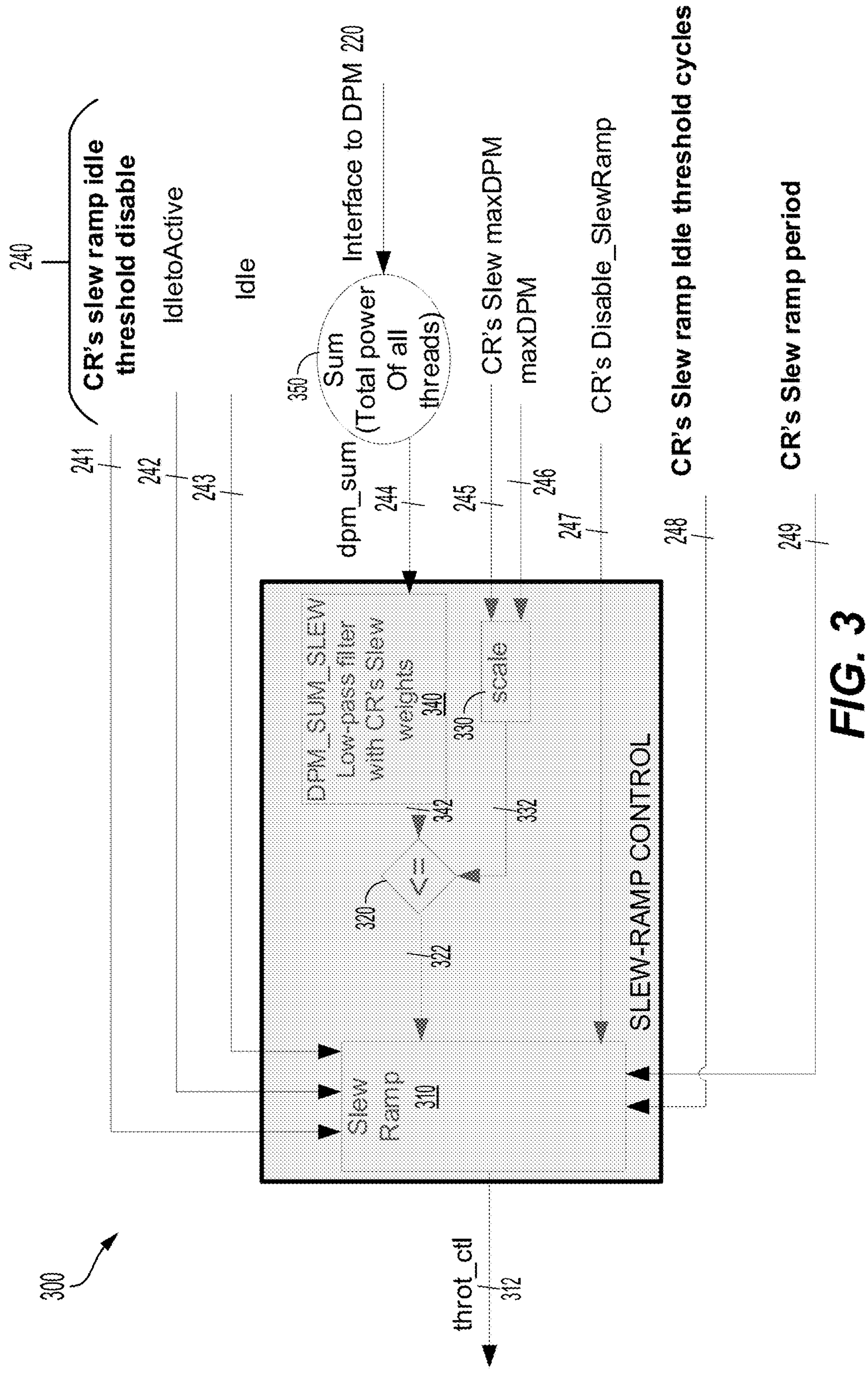
FIG. 3 is a block diagram illustrating a slew-control circuit of a limits management hardware (LMH) device of the neural processor unit (NPU) of FIG. 2, in accordance with various aspects of the present disclosure.

FIG. 3 is a block diagram illustrating a slew-ramp control circuit of a limits management hardware (LMH) device of the NPU of FIG. 2, in accordance with various aspects of the present disclosure. In this example, a slew-ramp control circuit 300 utilizes a programmable digital power meter (DPM) averaging circuit 340 configured with filter coefficients based on slew-ramp thresholds for monitoring PMIC violations. In this example, the programmable DPM averaging circuit 340 is implemented utilizing a low pass filter configured with slew weights from the CR 240 by accessing the configuration register values to configure the slew-ramp control circuit 300. In operation, the programmable DPM averaging circuit 340 receives a DPM sum (dpm_sum) 244 from a summation block 350 that interfaces with the DPM 220 of FIG. 2 to provide a total power of each of the threads executing in the thread pipeline execution 230 of FIG. 2.

In some implementations, the programmable DPM averaging circuit 340 is configured according to an inductor cool-off timer to account for a cool-off period of the inductors L of the VR 260. In operation, an output 342 of the programmable DPM averaging circuit 340 is compared to a scale value 332 from a scale block 330 at a comparator block 320 to determine whether the output 342 is less than or equal to the scale value 332. In this example, the scale block 330 computes the scale value 332 according to a slew-rate maximum DPM value 245 and a maximum DPM value 246 from the values of the CR 240. Additionally, an output 322 of the comparator block 320 is provided to a slew-ramp block 310.

According to various aspects of the present disclosure, operation of the slew-ramp block 310 to generate a throttle control signal 312 (throt_ctl) is controlled according to configured values of the CR 240. For example, a slew ramp period 249 may enable modulated ramp-up steps from a lowest performance to a highest performance according to an IdletoActive signal 242. Additionally, the slew-ramp block 310 receives a slew ramp idle threshold disable signal 241 corresponding to slew ramp idle threshold cycles 248 to determine an idle period of the slew-ramp block 310 when enabled. The slew-ramp block 310 is enabled/disabled according to a disable signal 247 and receives an idle signal 243.

In various aspects of the present disclosure, the slew-ramp block 310 utilizes the throttle control signal 312 to slowly ramp up the NPU 108 when coming out of idle in response to the idle signal 243. Additionally, the slew-ramp block 310 utilizes the throttle control signal 312 as a selected throttle control for slowly ramping up the NPU 108 when transitioning to a higher power while executing at lower power after violation of a slew power threshold according to the IdletoActive signal 242. In this implementation, PMIC droop voltage violations are mitigated by utilizing modulated ramp up steps from lowest to highest performance according to the throttle control signal 312. This slew-ramp control mitigates low-frequency voltage noise caused by the VR 260 when a load current ramp rate specified by the PMIC 250 is exceeded by the dynamic load current of the NPU 108.

During operation, when the disable signal 247 is asserted (e.g., CR's Disable_SlewRamp=1), the slew-ramp control functionality is bypassed and the throttle control signal 312 (throt_ctl) is driven directly. When the disable signal 247 is deasserted (e.g., CR's Disable_SlewRamp=0) and the slew ramp idle threshold disable signal 241 is asserted (e.g., CR's Slew ramp idle threshold disable=1), the slew-ramp control circuit 300 is triggered when the execution unit transitions from idle to active (e.g., the IdletoActive signal 242) transitions from to 0 to 1. This slowly ramps up instruction issue for addressing low frequency PMIC voltage undershoots.

In this example, the dpm_sum signal 244 is an input to the DPM_SUM_SLEW low pass filter of the programmable DPM averaging circuit 340. In this implementation, the programmable DPM averaging circuit 340 uses programmable CR's slew weights to perform a moving average function for calculating the average slew power across several cycles. The slew-ramp control circuit 300 is ready to engage when the average slew power (e.g., output 342) is not less than the scaled version (e.g., scale value 332) of the maxDPM (e.g., maximum DPM value 246) after applying the CR's slew maxDPM (e.g., slew-rate maximum DPM value 245) (e.g., ½, ¼, ⅛, 1/16 of maxDPM).

Once engaged, the slew-ramp block 310 applies the throttle control signal 312 (throt_ctl) to slowly ramp up the thread pipeline execution 230 over a period programmed in the slow ramp period 249 of the CR 240. For example, the programed slew ramp period may be a predetermined number of clock cycles (e.g., 32 to 4096 cycles or multiples of 32 cycles). If the thread pipeline execution 230 returns to idle or if the disable signal 247 is asserted (e.g., CR's Disable_SlewRamp=1), or if the slew ramp cycles exceed the programmed, slew ramp period 249 in clock cycles, the slew-ramp control circuit 300 does not engage any more. The slow ramp up steps through the slew-ramp block 310, which eventually drives the throttle control signal 212 (throt_ctl), performed by moving from a maximum throttle to minimum throttle in the slew-ramp block 310 for the programmed slew ramp cycles.

In various aspects of the present disclosure, the throttle control signal 312 generated at each step of the slew-ramp block 310 is a randomized pulse modulated output that changes from 255 of the throttle control signal 312 every 256 cycles to 0 of the throttle control signal 312 every 256 cycles. As shown in FIG. 2, the LMH system 200 implements updates to the existing slew ramp feature, as shown in FIG. 3. When the disable signal 247 is deasserted (e.g., Disable_SlewRamp=0) and the slew ramp idle threshold disable signal 241 is deasserted (e.g., Slew ramp idle threshold disable=0), the slew-ramp control circuit 300 also monitors the idle time in clock cycles (e.g., a PMIC's inductor cool off period).

In this mode, the throttle control signal 212 (throt_ctl) engages to trigger ramp up over the slew ramp period 249 in clock cycles when the idle time exceeds the programmed, slew ramp idle threshold cycles 248 in addition to the existing conditions of idle to active transitions described previously. The idle time is defined as cycles counted when either the thread pipeline execution 230 is not active or when the DPM_SUM_SLEW (average slew power) of the programmable DPM averaging circuit 340 is below the scaled version 332 of the maximum DPM value 246 after applying slew-rate maximum DPM value 245 (e.g, ½, ¼, ⅛, 1/16 of maxDPM). A process for voltage regulator noise mitigation is shown, for example, in FIG. 4.

Figure 4:
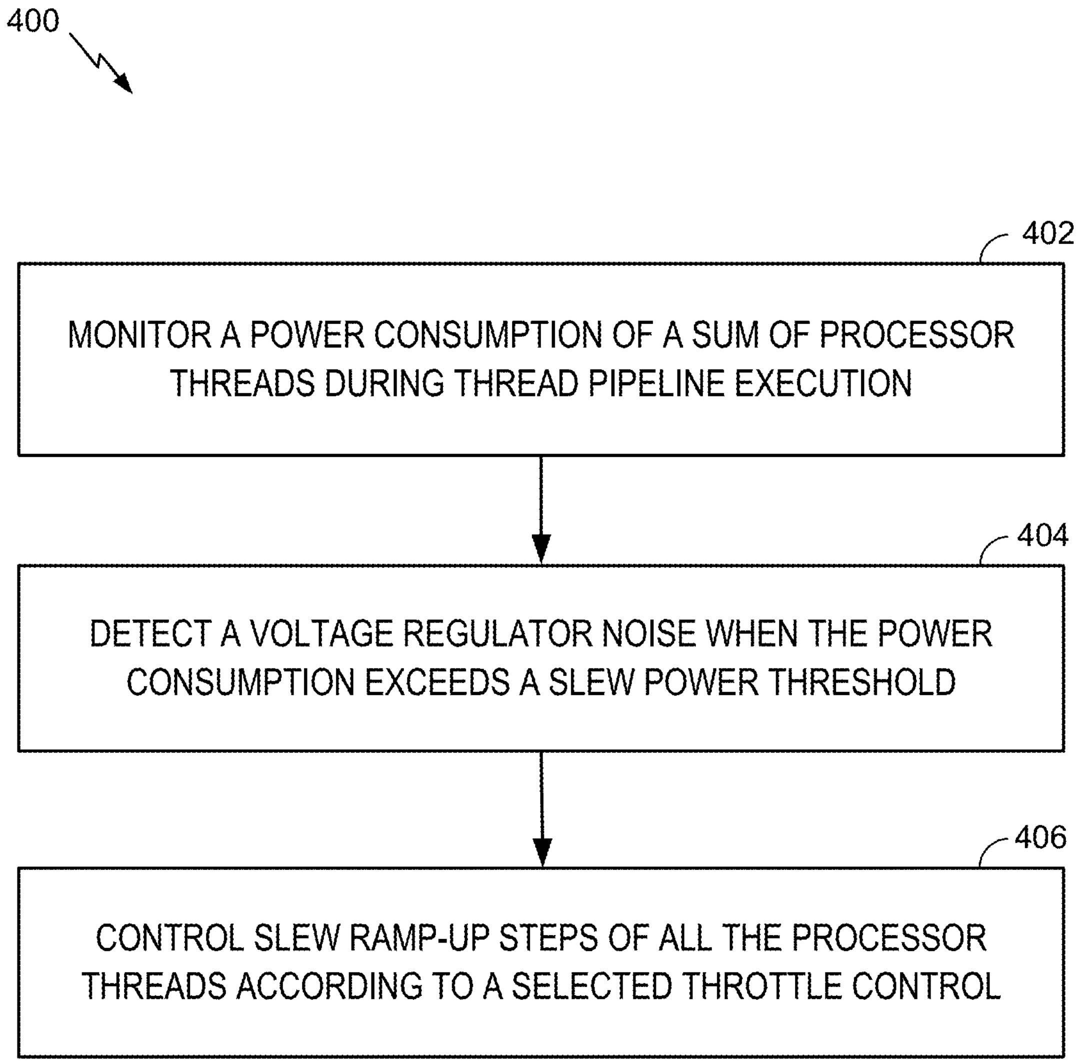
FIG. 4 is a process flow diagram illustrating a method for voltage regulator noise mitigation with processor control, according to various aspects of the present disclosure.

FIG. 4 is a process flow diagram illustrating a method 400 for voltage regulator noise mitigation with processor control, according to various aspects of the present disclosure. The method 400 begins at block 402, in which a power consumption of a sum of processor threads is monitored during thread pipeline execution. For example, as shown in FIG. 2, the NPU 108 is configured for multi-threaded execution of multiple processor threads. In operation, voltages of a sum of the processor threads executing in the thread pipeline execution 230 are monitored to determine whether a slew power threshold is exceeded, resulting in a noise violation by the VR 260.

At block 404, a voltage regulator noise is detected when the power consumption exceeds a slew power threshold. For example, as shown in FIG. 2, load currents seen by the PMIC 250 (e.g., ICM) are indirectly estimated by using the DPM 220 to provide a sum of power of the processor threads executing in the thread pipeline execution 230. In the example, the load currents seen by the PMIC 250 (e.g., ICM) are monitored to determine whether a slew power threshold is exceeded, resulting in a noise violation by the VR 260.

At block 406, slew ramp-up steps of all the processor threads are controlled according to a selected throttle control. For example, as shown in FIG. 3, the slew-ramp block 310 utilizes the throttle control signal 312 to slowly ramp up the NPU 108 when coming out of idle in response to the idle signal 243. Additionally, the slew-ramp block 310 utilizes the throttle control signal 312 as a selected throttle control for slowly ramping up the NPU 108 when transitioning to a higher power while executing at lower power after violation of a slew power threshold according to the IdletoActive signal 242. In this implementation, PMIC droop voltage violations are mitigated by utilizing modulated ramp up steps from lowest to highest performance according to the throttle control signal 312. This slew-ramp control mitigates low-frequency voltage noise caused by the VR 260 when a load current ramp rate specified by the PMIC 250 is exceeded by the dynamic load current of the NPU 108.

Figure 5:
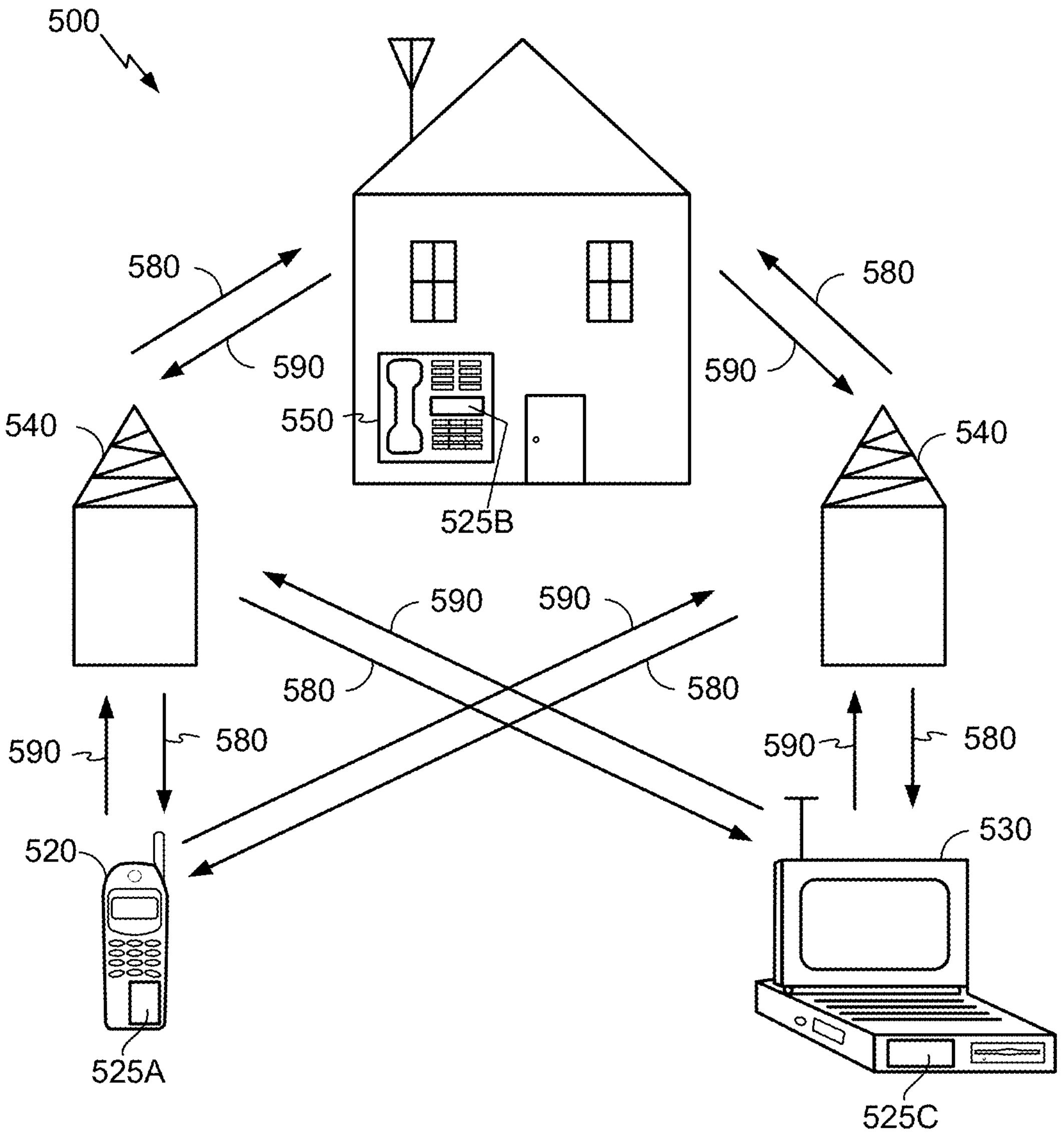
FIG. 5 is a block diagram showing an exemplary wireless communications system in which a configuration of the disclosure may be advantageously employed.

FIG. 5 is a block diagram showing an exemplary wireless communications system 500 in which an aspect of the present disclosure may be advantageously employed. For purposes of illustration, FIG. 5 shows three remote units 520, 530, and 550 and two base stations 540. It will be recognized that wireless communications systems may have many more remote units and base stations. Remote units 520, 530, and 550 include integrated circuit (IC) devices 525A, 525C, and 525B that include the disclosed voltage regulator noise mitigation with processor control. It will be recognized that other devices may also include the voltage regulator noise mitigation, such as the base stations 540, switching devices, and network equipment. FIG. 5 shows forward link signals 580 from the base stations 540 to the remote units 520, 530, and 550, and reverse link signals 590 from the remote units 520, 530, and 550 to the base stations 540.

In FIG. 5, remote unit 520 is shown as a mobile telephone, remote unit 530 is shown as a portable computer, and remote unit 550 is shown as a fixed location remote unit in a wireless local loop system. For example, the remote units may be a mobile phone, a hand-held personal communication systems (PCS) unit, a portable data unit, such as a personal data assistant, a GPS enabled device, a navigation device, a set top box, a music player, a video player, an entertainment unit, a communications device, personal digital assistant (PDA), a fixed location data unit, such as meter reading equipment, or other device that stores or retrieves data or computer instructions, or combinations thereof. Although FIG. 5 illustrates remote units according to the aspects of the present disclosure, the present disclosure is not limited to these exemplary illustrated units. Aspects of the present disclosure may be suitably employed in many devices, which include the disclosed voltage regulator noise mitigation with processor control.

Figure 6:
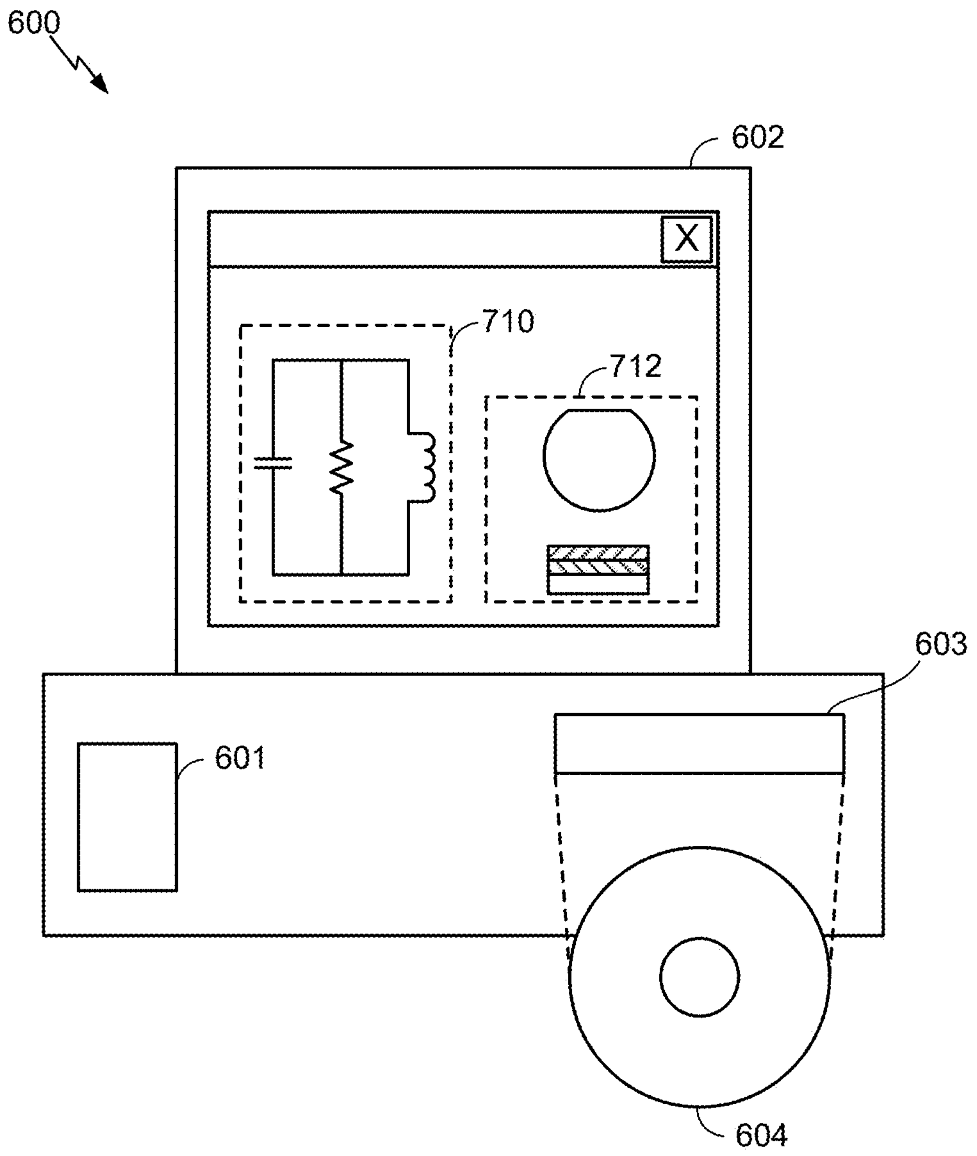
FIG. 6 is a block diagram illustrating a design workstation used for circuit, layout, and logic design of a semiconductor component according to one configuration.

FIG. 6 is a block diagram illustrating a design workstation used for circuit, layout, and logic design of a semiconductor component, such as the voltage regulator noise mitigation with processor control disclosed above. A design workstation 600 includes a hard disk 601 containing operating system software, support files, and design software such as Cadence or OrCAD. The design workstation 600 also includes a display 602 to facilitate design of a circuit 610, such as the disclosed voltage regulator noise mitigation with processor control. A storage medium 604 is provided for tangibly storing the design of the circuit 610 (e.g., the voltage regulator noise mitigation with processor control). The design of the circuit 610 or a limits management hardware (LMH) component 612 may be stored on the storage medium 604 in a file format such as GDSII or GERBER. The storage medium 604 may be a compact disc read-only memory (CD-ROM), digital versatile disc (DVD), hard disk, flash memory, or another appropriate device. Furthermore, the design workstation 600 includes a drive apparatus 603 for accepting input from or writing output to the storage medium 604.

Data recorded on the storage medium 604 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 604 facilitates the design of the circuit 610 or the LMH component 612 by decreasing the number of processes for designing semiconductor wafers.

Implementation examples are described in the following numbered clauses:

1. A method for voltage regulator noise mitigation with processor control, the method comprising:
monitoring a power consumption of a sum of processor threads during thread pipeline execution;
detecting a voltage regulator noise when the power consumption exceeds a slew power threshold; and
controlling slew ramp-up steps of all the processor threads according to a selected throttle control.
2. The method of clause 1, in which controlling the slew ramp-up steps comprises reducing instruction-issue to stall the slew ramp-up steps of the thread pipeline execution.
3. The method of any of clauses 1 or 2, in which controlling the slew ramp-up steps comprises modulating the slew ramp-up steps from a lowest performance to a highest performance.
4. The method of any of clauses 1 or 2, in which controlling the slew ramp-up steps comprises setting an inductor cool-off timer as the selected throttle control.
5. The method of any of clauses 1-4, in which controlling the slew ramp-up steps comprises accessing configuration register values to configure a slew-ramp control circuit.
6. The method of clause 5, in which the slew-ramp control circuit is integrated with a multi-threaded processor.
7. The method of clause 5, in which the slew-ramp control circuit comprises a programmable digital power meter (DPM) averaging circuit having a low pass filter configured with slew weights from the configuration register values.
8. The method of any of clauses 1-7, in which controlling the slew ramp-up steps comprises feeding a throttle control signal to the thread pipeline execution to modulate the slew ramp-up steps from a lowest performance to a highest performance.
9. The method of any of clauses 1-8, in which detecting the voltage regulator noise comprises detecting a load current ramp rate of the sum of the processor threads greater than the load current ramp rate specified by a power management integrated circuit (PMIC).
10. A voltage regulator noise mitigation system, comprising:
a voltage regulator;
a power management integrated circuit (PMIC); and
a multi-threaded processor comprising a slew-ramp control circuit to control slew ramp-up steps of all processor threads according to a selected throttle control when a noise violation of the voltage regulator is detected due to power consumption of the multi-threaded processor exceeding a slew power threshold specified by the PMIC.
11. The voltage regulator noise mitigation system of clause 10, in which the multi-threaded processor comprises a neural processor unit (NPU).
12. The voltage regulator noise mitigation system of any of clauses 10 or 11, in which the slew-ramp control circuit is configured to reduce instruction-issue to stall the slew ramp-up steps of a thread pipeline execution of the multi-threaded processor.
13. The voltage regulator noise mitigation system of any of clauses 10 or 11, in which the slew-ramp control circuit is configured to modulate the slew ramp-up steps from a lowest performance to a highest performance.
14. The voltage regulator noise mitigation system of any of clauses 10-13, in which the slew-ramp control circuit is configured to set an inductor cool-off timer as the selected throttle control.
15. The voltage regulator noise mitigation system of any of clauses 10-14, in which the multi-threaded processor is configured to access configuration register values to configure the slew-ramp control circuit.
16. The voltage regulator noise mitigation system of clause 15, in which the slew-ramp control circuit is integrated with a neural processing unit (NPU).
17. The voltage regulator noise mitigation system of clause 15, in which the slew-ramp control circuit comprises a programmable digital power meter (DPM) averaging circuit having a low pass filter configured with slew weights from the configuration register values.
18. The voltage regulator noise mitigation system of any of clauses 10-17, in which the slew-ramp control circuit is configured to feed a throttle control signal to a thread pipeline execution of the multi-threaded processor to modulate the slew ramp-up steps from a lowest performance to a highest performance.
19. The voltage regulator noise mitigation system of any of clauses 10-17, in which the slew-ramp control circuit is configured to detect a load current ramp rate of the sum of the processor threads greater than the load current ramp rate specified by the PMIC.
20. The voltage regulator noise mitigation system of any of clauses 10-19, in which the slew-ramp control circuit is integrated in a limits management hardware (LMH).

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a non-transitory computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include random access memory (RAM), read-only memory (ROM), electrically erasable programmable read-only memory (EEPROM), compact disc read-only memory (CD-ROM) or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above, and below may refer to sides of a substrate or electronic device. Moreover, the scope of the present application is not intended to be limited to the configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function, or achieve substantially the same result as the corresponding configurations described herein, may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the application and design constraints imposed on the overall system. Skilled artisans may implement the described functionality in varying ways for each application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in random access memory (RAM), flash memory, read-only memory (ROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general-purpose or special-purpose computer. By way of example, and not limitation, such computer-readable media can include random access memory (RAM), read-only memory (ROM), electrically erasable programmable read-only memory (EEPROM), compact disc read-only memory (CD-ROM) or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc, where disks usually reproduce data magnetically, while discs reproduce data optically with lasers. Combinations of the above should also be included within the scope of computer-readable media.

The previous description of the present disclosure is provided to enable any person skilled in the art to make or use the disclosure. Various modifications to the present disclosure will be readily apparent to those skilled in the art, and the generic principles defined herein may be applied to other variations without departing from the spirit or scope of the disclosure. Thus, the present disclosure is not intended to be limited to the examples and designs described herein but is to be accorded the widest scope consistent with the principles and novel features disclosed herein.

What is claimed:

1. A method for voltage regulator noise mitigation with processor control, the method comprising:

monitoring a power consumption of a sum of processor threads during thread pipeline execution;

detecting a voltage regulator noise when the power consumption exceeds a slew power threshold specified by a power management integrated circuit (PMIC), the slew power threshold corresponding to a load current ramp rate of the sum of the processor threads greater than a load current ramp rate specified by the PMIC; and controlling slew ramp-up steps of all the processor threads according to a selected throttle control.

2. The method of claim 1, in which controlling the slew ramp-up steps comprises reducing instruction-issue to stall the slew ramp-up steps of the thread pipeline execution.

3. The method of claim 1, in which controlling the slew ramp-up steps comprises modulating the slew ramp-up steps from a lowest performance to a highest performance.

4. The method of claim 1, in which controlling the slew ramp-up steps comprises setting an inductor cool-off timer as the selected throttle control.

5. The method of claim 1, in which controlling the slew ramp-up steps comprises accessing configuration register values to configure a slew-ramp control circuit.

6. The method of claim 5, in which the slew-ramp control circuit is integrated with a multi-threaded processor.

7. The method of claim 5, in which the slew-ramp control circuit comprises a programmable digital power meter (DPM) averaging circuit having a low pass filter configured with slew weights from the configuration register values.

8. The method of claim 1, in which controlling the slew ramp-up steps comprises feeding a throttle control signal to the thread pipeline execution to modulate the slew ramp-up steps from a lowest performance to a highest performance.

9. A voltage regulator noise mitigation system, comprising:

a voltage regulator;

a power management integrated circuit (PMIC); and a multi-threaded processor comprising a slew-ramp control circuit to control slew ramp-up steps of all processor threads according to a selected throttle control when a noise violation of the voltage regulator is detected due to the power consumption of the sum of processor threads exceeding a slew power threshold specified by the PMIC, the slew power threshold corresponding to a load current ramp rate of the sum of the processor threads greater than a load current ramp rate specified by the PMIC.

10. The voltage regulator noise mitigation system of claim 9, in which the multi-threaded processor comprises a neural processor unit (NPU).

11. The voltage regulator noise mitigation system of claim 9, in which the slew-ramp control circuit is configured to reduce instruction-issue to stall the slew ramp-up steps of a thread pipeline execution of the multi-threaded processor.

12. The voltage regulator noise mitigation system of claim 9, in which the slew-ramp control circuit is configured to modulate the slew ramp-up steps from a lowest performance to a highest performance.

13. The voltage regulator noise mitigation system of claim 9, in which the slew-ramp control circuit is configured to set an inductor cool-off timer as the selected throttle control.

14. The voltage regulator noise mitigation system of claim 9, in which the multi-threaded processor is configured to access configuration register values to configure the slew-ramp control circuit.

15. The voltage regulator noise mitigation system of claim 14, in which the slew-ramp control circuit is integrated with a neural processing unit (NPU).

16. The voltage regulator noise mitigation system of claim 14, in which the slew-ramp control circuit comprises a programmable digital power meter (DPM) averaging circuit having a low pass filter configured with slew weights from the configuration register values.

17. The voltage regulator noise mitigation system of claim 9, in which the slew-ramp control circuit is configured to feed a throttle control signal to a thread pipeline execution of the multi-threaded processor to modulate the slew ramp-up steps from a lowest performance to a highest performance.

18. The voltage regulator noise mitigation system of claim 9, in which the slew-ramp control circuit is integrated in a limits management hardware (LMH).

* * * * *